(12) United States Patent
Fjelstad

(10) Patent No.: US 6,774,317 B2
(45) Date of Patent: Aug. 10, 2004

(54) CONNECTION COMPONENTS WITH POSTS

(75) Inventor: Joseph C. Fjelstad, Maple Valley, WA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/107,995

(22) Filed: Mar. 27, 2002

(65) Prior Publication Data

US 2002/0096787 A1 Jul. 25, 2002

Related U.S. Application Data

(63) Continuation of application No. 09/707,452, filed on Nov. 7, 2000, which is a division of application No. 08/885,238, filed on Jun. 30, 1997, now Pat. No. 6,177,636, which is a continuation of application No. 08/366,236, filed on Dec. 29, 1994, now abandoned.

(51) Int. Cl.⁷ .................. H05K 12/04; H01R 12/04
(52) U.S. Cl. .................. 174/267; 174/262; 361/774; 361/808; 257/737
(58) Field of Search .................. 174/267, 254, 174/255, 262, 261; 361/774, 307, 808

(56) References Cited

U.S. PATENT DOCUMENTS

| | | | |
|---|---|---|---|
| 3,465,435 A | | 9/1969 | Steranko |
| 4,067,104 A | | 1/1978 | Tracy |
| 4,258,382 A | * | 3/1981 | Harris .................. 257/737 |
| 4,466,184 A | | 8/1984 | Cuneo et al. |
| 4,579,022 A | | 4/1986 | Kasai et al. |
| 4,642,889 A | | 2/1987 | Grabbe |
| 4,818,728 A | | 4/1989 | Rai et al. |
| 4,825,539 A | | 5/1989 | Nagashima et al. |
| 4,878,990 A | * | 11/1989 | Dugan et al. .................. 29/827 |
| 4,955,523 A | | 9/1990 | Carlommagno et al. |
| 4,961,259 A | | 10/1990 | Schreiber |
| 4,969,827 A | * | 11/1990 | Hahs, Jr. .................. 439/68 |
| 5,067,007 A | | 11/1991 | Kanji et al. |
| 5,118,029 A | * | 6/1992 | Fuse et al. .................. 228/198 |
| 5,118,386 A | * | 6/1992 | Kataoka et al. .................. 216/13 |
| 5,133,495 A | | 7/1992 | Angulas et al. |
| 5,148,265 A | | 9/1992 | Khandros et al. |
| 5,148,266 A | | 9/1992 | Khandros et al. |
| 5,160,409 A | * | 11/1992 | Moore et al. .................. 216/13 |
| 5,203,075 A | | 4/1993 | Angulas et al. |
| 5,213,676 A | | 5/1993 | Reele et al. |
| 5,237,130 A | * | 8/1993 | Kulesza et al. .................. 174/260 |
| 5,296,649 A | * | 3/1994 | Kosuga et al. .................. 174/250 |
| 5,316,788 A | | 5/1994 | Dibble et al. |
| 5,327,013 A | * | 7/1994 | Moore et al. .................. 257/772 |
| 5,334,804 A | * | 8/1994 | Love et al. .................. 174/267 |
| 5,354,205 A | | 10/1994 | Feigenbaum et al. |
| 5,455,390 A | | 10/1995 | DiStefano et al. |
| 5,574,311 A | * | 11/1996 | Matsuda .................. 257/697 |

FOREIGN PATENT DOCUMENTS

| | | |
|---|---|---|
| JP | 3215991 | 9/1991 |
| JP | 3269977 | 12/1991 |

* cited by examiner

*Primary Examiner*—Kamand Cuneo
*Assistant Examiner*—J B Patel
(74) *Attorney, Agent, or Firm*—Lerner, David, Littenberg, Krumholz & Mentlik, LLP

(57) ABSTRACT

A subtractively created interconnection scheme and apparatus, typically used with microelectronic devices, wherein a flexible support structure is attached to a conductive sheet. The conductive sheet is then selectively removed, preferably using an etching process, thereby producing a plurality of posts with tips which are substantially coplanar with respect to one another. Each post becoming an individual interconnection between the microelectronic device and a supporting substrate.

11 Claims, 5 Drawing Sheets

CONNECTION COMPONENTS WITH POSTS

CROSS-REFERENCE TO RELATED APPLICATIONS

The present application is a continuation of U.S. patent application Ser. No. 09/707,452 filed Nov. 7, 2000, which application is a divisional of U.S. patent application Ser. No. 08/885,238 filed Jun. 30, 1997, which issued as U.S. Pat. No. 6,177,636 on Jan. 23, 2001 and which is a continuation of U.S. patent application Ser. No. 08/366,236 filed on Dec. 29, 1994 now abandoned.

FIELD OF THE INVENTION

The present invention relates, generally, to interconnecting microelectronic devices and supporting substrates, and more particularly relates to an apparatus and a method of interconnecting microelectronic devices to supporting substrates using subtractively created members.

BACKGROUND OF THE INVENTION

Complex microelectronic devices such as modem semiconductor chips require many hundreds of input and output connections to other electronic components. These device connections are generally either disposed in regular grid-like patterns, substantially covering the bottom surface of the device (commonly referred to as an "area array") or in elongated rows extending parallel to and adjacent each edge of the device's front surface. The various prior art processes for making the interconnections between the microelectronic device and the supporting substrate use prefabricated arrays or rows of leads/discrete wires, solder bumps or combinations of both, such as with wire bonding, tape automated bonding ("TAB") and flip/chip bonding.

In a wirebonding process, the microelectronic device may be physically mounted on a supporting substrate. A fine wire is fed through a bonding tool and the tool is brought into engagement with a contact pad on the device so as to bond the wire to the contact pad. The tool is then moved to a connection point of the circuit on the substrate, so that a small piece of wire is dispensed and formed into a lead, and connected to the substrate. This process is repeated for every contact on the chip. The wire bonding process is also commonly used to connect the die bond pads to lead frame fingers which are then connected to the supporting substrate.

In a tape automated bonding ("TAB") process, a dielectric supporting tape, such as a thin foil of polyimide is provided with a hole slightly larger than the microelectronic device. An array of metallic leads is provided on one surface of the dielectric film. These leads extend inwardly from around the hole towards the edges of the hole. Each lead has an innermost end projecting inwardly, beyond the edge of the hole. The innermost ends of the leads are arranged side by side at a spacing corresponding to the spacing of the contacts on the device. The dielectric film is juxtaposed with the device so that the hole is aligned with the device and so that the innermost ends of the leads will extend over the front or contact bearing surface on the device. The innermost ends of the leads are then bonded to the contacts of the device, typically using ultrasonic or thermocompression bonding, and the outer ends of the leads are connected to external circuitry.

In both wire bonding and conventional tape automated bonding, the pads on the substrate are arranged outside of the area covered by the chip, so that the wires or leads fan out from the chip to the surrounding pads. The area covered by the entire assembly is considerably larger than the area covered by the chip. This makes the entire assembly substantially larger than it otherwise would be. Because the speed with which a microelectronic assembly can operate is inversely related to its size, this presents a serious drawback. Moreover, the wire bonding and tape automated bonding approaches are generally most workable with chips having contacts disposed in rows extending along the edges of the chip. They generally do not allow use with chips having contacts disposed in an area array.

In the flip-chip mounting technique, the front or contact bearing surface of the microelectronic device faces towards the substrate. Each contact on the device is joined by a solder bond to the corresponding contact pad on the supporting substrate, as by positioning solder balls on the substrate or device, juxtaposing the device with the substrate in the front-face-down orientation and momentarily reflowing the solder. The flip-chip technique yields a compact assembly, which occupies an area of the substrate no larger than the area of the chip itself. However, flip-chip assemblies suffer from significant problems when encountering thermal stress. The solder bonds between the device contacts and the supporting substrate are substantially rigid. Changes in the relative sizes of the device and the supporting substrate due to thermal expansion and contraction in service create substantial stresses in these rigid bonds, which in turn can lead to fatigue failure of the bonds. Moreover, it is difficult to test the chip before attaching it to the substrate, and hence difficult to maintain the required outgoing quality level in the finished assembly, particularly where the assembly includes numerous chips.

As the number of interconnections per microelectronic device increases, the issue of interconnection planarity continues to grow as well. If the interconnections are not planar with respect to each other, it is likely that many of the interconnections will not electrically contact their juxtaposed contact pads on a supporting substrate, such as a standard printed wiring board. None of the above described techniques provides a cost effective interconnection scheme which guarantees the planarity of the interconnections so that each is assured of making an electrical contact with the contact pads on the opposed supporting substrate.

Numerous attempts have been made to solve the foregoing interconnection problems. An interconnection solution put forth in U.S. Pat. No. 4,642,889, entitled "Compliant Interconnection and Method Therefor" issued Apr. 29, 1985 to Grabbe creates an interconnection scheme by embedding wires within each solder column/ball to reinforce the solder thereby allowing higher solder pedestals and more elasticity. Further interconnection solutions put forth include providing a combination of solder and high lead solder thereby allowing higher solder pedestals and more elasticity given the high lead content of the solder, as found in U.S. Pat. No. 5,316,788, entitled "Applying Solder to High Density Substrates" issued May 31, 1994 to Dibble et al. and U.S. Pat. Nos. 5,203,075 & 5,133,495, respectively issued on Apr. 20, 1993 and Jul. 28, 1992 to Angulas et al.

U.S. Pat. No. 4,955,523, entitled "Interconnection of Electronic Components" issued on Sep. 11, 1990 to Calomagno et al. puts forth a still further interconnection technique in which wires are wirebonded to the contact pads on a first surface, cut to a desired length and then attached to a second opposing surface by placing each of the wires in a "well" of conductive material, such as solder. While the wires then give a certain amount of compliancy to the structure, this technique encounters difficulties in controlling unwanted bending and electrical shorting of the wires prior to and during the coupling step in their respective solder wells. Similarly, U.S. Pat. No. 5,067,007, entitled "Semiconductor Device having Leads for Mounting to a Surface of a Printed Circuit Board" issued Nov. 19, 1991 to Kanji et al. discloses the use of stiff or deformable lead pins to increase the pin pitch and deal with problems stemming from thermal coefficient of expansion mismatches between the device and a printed circuit board. Besides the potential for bending and shorting of the pins as described above, the pins are individually attached to both the device and the printed circuit board by brazing or soldering making this a time consuming and less than optimum solution from a manufacturing point of view.

U.S. Pat. No. 4,067,104, entitled "Method of Fabricating an Array of Flexible Metallic Interconnects for Coupling Microelectronic Components" issued on Jan. 10, 1978 to Tracy uses an additive technique where the interconnections are created by providing a layer of photoresist, removing portions of the photoresist and depositing metal within the removed portions. By successively following this technique, a plurality of metalized columns are created and coupled to opposing contact pads on a supporting substrate by a suitable method, such as flip chip bonding, cold welding, diffusion bonding or melting. The photoresist is then removed. However, interconnection planarity issues can become a problem when practicing the invention disclosed in Tracy '104. Further, the strength of each of the interconnection columns may be impeded due to the joining of the different layers of metal and to thermal cycling fatigue.

One commonly assigned invention, U.S. patent application Ser. No. 08/190,779, filed Feb. 1, 1994 and issued as U.S. Pat. No. 5,445,390 on Oct. 3, 1995, deals effectively, but specifically differently, with many of the problems encountered by the prior art. In one embodiment, the '779 application interconnects the device contact pads to the supporting substrate terminals by using leads which are coupled to the terminals in a conventional manner, such as by soldering, such that they extend substantially side by side. The unconnected ends are then coupled to the contact pads through the use of predetermined pressure and temperature conditions. A support layer is then disposed between the device and the supporting substrate and further surrounds and supports the leads. This structure effectively deals with thermal expansion mismatch and lead shorting problems.

Despite these and other efforts in the art, still further improvements in microelectronic interconnection technology would be desirable.

SUMMARY OF THE INVENTION

The present invention provides a method and apparatus for providing interconnections between a microelectronic device and a supporting substrate which substantially obviates many of the problems encountered by the prior art.

One embodiment of the present invention provides a method of fabricating an interconnection component for a microelectronic device comprises providing a support structure, typically comprised of a flexible but substantially inextensible substrate, having a first and a second surface, where a conductive sheet is coupled to the first surface of the support structure. The conductive sheet is then selectively removed, typically using an etching process, thereby producing a highly planar, cost effective plurality of substantially rigid posts each of which eventually become the interconnections between the microelectronic device and a supporting substrate. The etching process generally first includes applying a photoresist layer to the conductive sheet and exposing portions of the photoresist layer to form etch resistant portions and remainder portions. The remainder portions may then be removed and the conductive sheet may be etched around the etch resistant portions.

A compliant layer may then be provided on the second surface of the support structure and a microelectronic device having a plurality of bond pads may be engaged with the exposed surface of the compliant layer. The compliant layer is used to substantially accommodate thermal coefficient of expansion mismatches between the device and a supporting substrate when the device is in use. Each bond pad is then electrically coupled to at least one conductive post. The bond pads and posts may be coupled in a number of different ways, including plating a plurality of etch resistant conductive leads on either the first surface of the support structure or the conductive sheet such that the leads are sandwiched between the supporting substrate and the conductive sheet. After the posts are created, the bond pads may be electrically connected to respective leads. Alternately, the conductive leads could be formed on the second surface of the support structure and coupled to each post through a conductive via. A highly conductive layer, such as gold, may optionally be plated on the surface of the posts to ensure a good electrical connection when the posts are coupled to contact pads on a supporting substrate.

The foregoing and other objects and advantages of the present invention will be better understood from the following Detailed Description of a Preferred Embodiment, taken together with the attached Figures.

DETAILED DESCRIPTION OF A PREFERRED EMBODIMENT

Figure 1A:
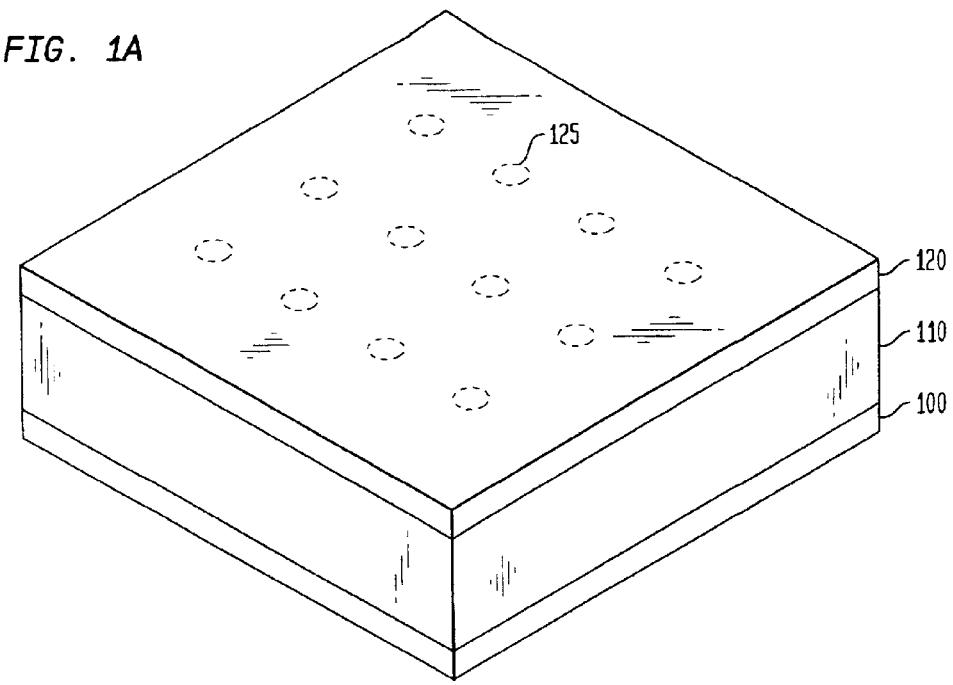
FIGS. 1A and 1B are perspective views illustrating the process of subtractively creating the interconnections according to one embodiment of the present invention.
Figure 1B:
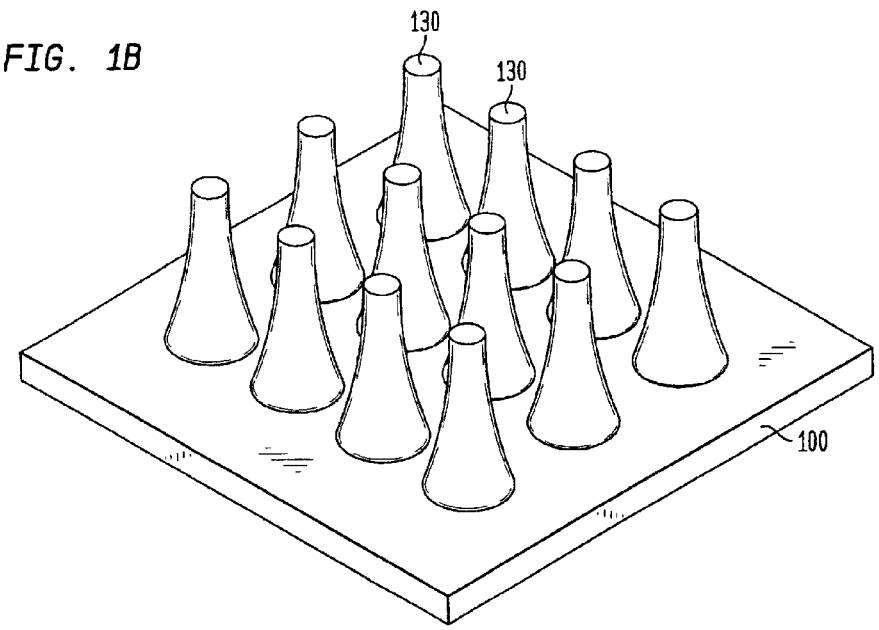

Referring to FIGS. 1A and 1B, a top surface of a support structure 100 is coupled to a conductive sheet 110. In the preferred embodiment of the invention, the support structure is a flexible, but substantially inextensible, film preferably formed from a polymeric material, such as Kapton™, of an approximate thickness between 25 microns and 75 microns and is laminated to the second surface of the conductive sheet. However, the support structure could be comprised of many other suitable materials and may further be semiflexible or substantially rigid. The conductive sheet 110 is preferably comprised of a conductive metal, such as copper, copper alloys or phosphor bronze, among other materials. Portions of the conductive sheet are selectively removed by any suitable means to create a plurality of subtractively created, substantially rigid posts 130, as shown in FIG. 1B.

In the preferred embodiment, portions of the conductive sheet are removed by first providing a photoresist mask on the surface of the conductive sheet and etching away the conductive sheet 110 around the mask portions. This is preferably accomplished by coupling a photoresist layer 120 to the top surface of the conductive sheet 110. Selected portions of the photoresist layer 120 are then exposed and developed using standard industry techniques, resulting in a plurality of etch resistant photoresistive portions 125 atop the conductive sheet 100. A one sided etching process is then employed to remove portions of the conductive sheet 110 around the plurality of etch resistant photoresistive portions 125 while substantially leaving the portions beneath the plurality of etch resistant photoresistive portions 125, as shown in FIG. 1B. The etch profile of features created from a conductive sheet, such as a metal foil, can be influenced by the process used to produce them. The two most common methods of etching are batch immersion in an etchant solution and liquid etchant spraying or impingement. In batch etching, the features can be more uniformly created. Etching proceeds isotropically removing metal at a basically uniform rate both vertically and laterally. This results in creating posts having substantially uniformly sloping vertical sides of approximately a 45° angle relative to the surface of the support structure. Etching normally proceeds rather slowly in batch processing providing sufficient time to replenish the active etchant solution to foil under the resist. In contrast, a spray etching technique typically impinges the part at more of a 90° angle, facilitating the etching of surfaces exposed to the impingement. While the etching process still progresses in a more or less isotropic fashion, the etch resistant photoresist portions 125 act as a shield causing the etching process to produce an etch profile which forms "cooling tower" shaped posts 130 having a broad base which thins as it reaches the vertical center of the post 130 and flares back out slightly as it reaches its apex. These features are caused by the "splash back" of the etchant solution against the walls of the emerging post and can be more or less exaggerated by altering the pressure, concentration and or formula of the etchant within the bounds of the photoresist's resistance to the etchant.

The height of each post will vary directly with the thickness of the conductive sheet 110, but typically will be in the range of 125 to 500 microns. Because of their shape and rigidity, the conductive posts 130 will resist deformation. A fine post connect pitch can therefore be created without substantial fear that the posts 130 will be bent into electrical contact with each other. The possible pitch of the bumps is also a function of the thickness of the sheet of conductive material. The thinner the conductive sheet, the finer the possible pitch of the bumps. Also, this process of creating the posts is cost and time effective when compared with methods which create each bump by plating or soldering. Further, the posts created with this subtractive process are extremely uniform and planar when compared to solder or plated bumps because they are created from a single planar, conductive sheet. This ensures that each of the bumps will make contact with respective contact pads on a supporting substrate, such as a printed wiring board, without the exertion of undue pressure on the top surface of the microelectronic device.

The exterior surfaces of the posts may be optionally plated with a highly conductive layer, such as gold, gold/nickel, gold/osmium or gold/palladium, or alternately plated with a wear resistant, conductive coating such as osmium to ensure that a good connection is made when the posts are either soldered or socketed to a supporting substrate, as described more fully below.

Figure 2A:
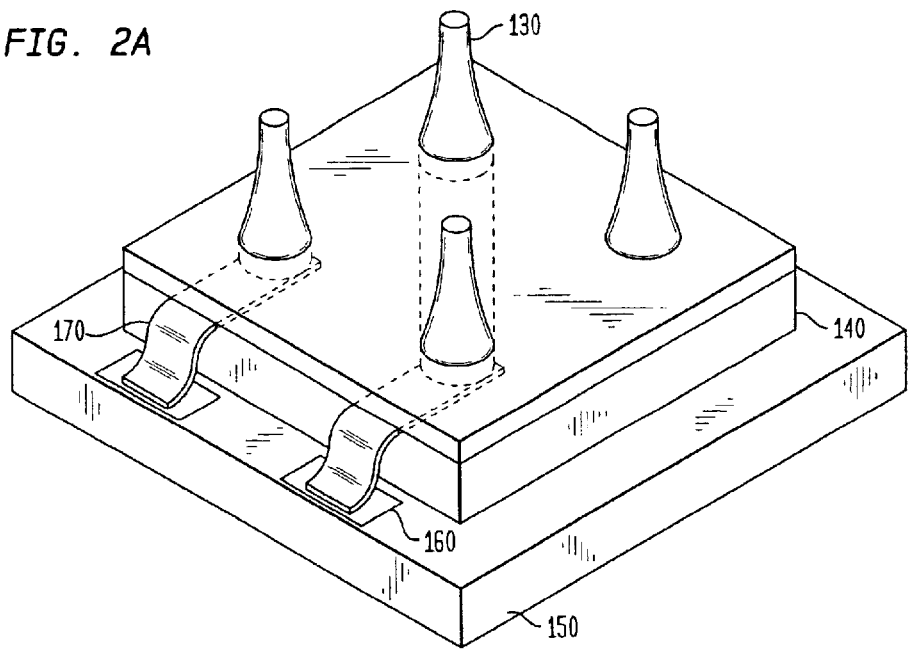
FIGS. 2A and 2B are perspective views each showing the embodiment in FIG. 1B coupled to a compliant layer and a microelectronic device according to one embodiment of the present invention.
Figure 2B:
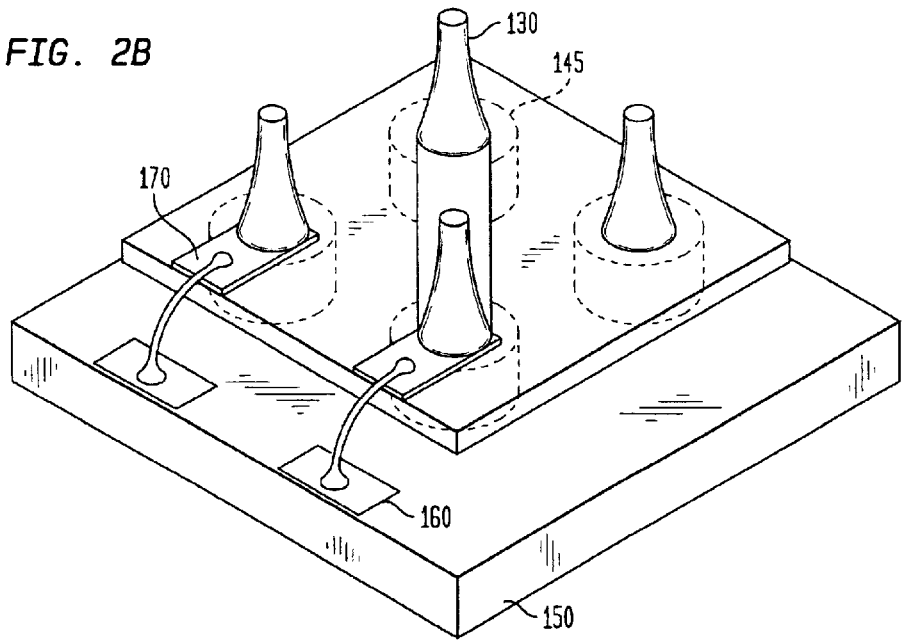

Referring now to FIG. 2A, a compliant layer 140 is coupled to the back surface of the support structure 100. The compliant layer 140 is typically made of an elastomer material, such as the Dow Coming silicon elastomer 577 known as Silgard®. The compliant layer 140 is coupled to the back surface of the support structure 100 by conventional stencil printing techniques. The silicon elastomer used in the preferred embodiment is filled with about 5–10% of fumed silica in order to obtain a stiff consistency that allows the layer 140 to retain its shape after the stencil is removed. The silicon is then cured at a suitable temperature. Typically, the thickness of the complaint layer is 150 microns, plus or minus 12.5 microns. The compliant layer 140 may alternately be replaced with a plurality of compliant pads 145 each positioned beneath a respective post, as shown in FIG. 2B. The pads 145 are also typically stenciled on the back surface of the support structure 100 and the original stiff formulation of the elastomer allows each individual pad 145 to retain its shape after the stencil has been removed. The exposed surface of the compliant layer is next engaged with a surface of a microelectronic device 150 having a plurality of bond pads 160 thereon.

Referring now to FIG. 2B, before the bond pads 160 can be connected to the conductive posts 130, a method of electrically connecting the posts 130 to the bond pads 160 must be supplied. One method includes providing etch-resistant conductive leads 170, such as copper leads which have been lithographically formed on the top surface of the support structure 100 plated with gold prior to coupling the structure 100 to the conductive sheet 110. After the conductive sheet 110 has been reduced to the conductive posts 130, shown in FIG. 2A, the etch resistant conductive leads may be connected to the bond pads 160 by any suitable manner, such as wire bonding or by allowing the leads to extend beyond the edge of the support structure such that they may be bent towards and thermosonically or ultrasonically bonded to a respective bond pad, as shown in FIG. 2A. An alternate method of creating a similar embodiment is to first plate a plurality of either one layer or a multi-layer etch resistant conductive leads, such as gold or gold/copper leads, to the bottom surface of the conductive sheet 110 prior to coupling the conductive sheet 110 and the support structure 100. Portions of the conductive sheet are then removed to create the conductive posts 130 allowing the bond pads 160 to be electrically connected to the posts 130 by the conductive leads. A further alternate solution involves forming the leads on the second side of the support structure 100 and connecting the posts through conductive vias extending from the first to the second surface of the support structure 100.

A further embodiment of the present invention, includes directly attaching the support structure 100 to the microelectronic device such that each post is in electrical contact with a juxtaposed bond pad on the microelectronic device. This is typically accomplished using a conductive via positioned beneath each of the posts and extending from a first to a second surface of the support structure. The via may be created by punching or laser ablating holes in the support structure and plating a conductive metal, such as copper into each of the holes. A joining layer, such as a gold/tin or silver/tin alloy, is next typically coupled to the copper. The joining layer will weld to its respective bond pad under the correct temperature, pressure or vibration stresses.

Figure 3A:
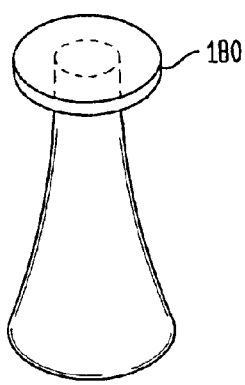
FIGS. 3A–C are perspective views each showing one possible shape of the subtractively created interconnections according to the present invention.
Figure 3B:
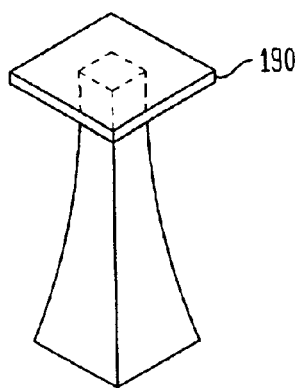
Figure 3C:
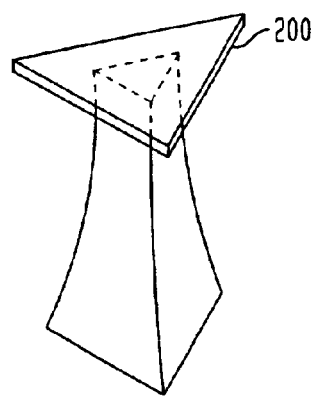

As stated above, the shape of the posts 130 can depend on the process used to remove the surrounding conductive material. However, the shape of the etch resistant photoresist portions 125 in FIG. 1A may also produce different shaped posts from the conductive sheet material. For example, FIG. 3A shows a substantially in the form of a surface of revolution which is the result of using circular resist portions 180 on the conductive sheet 110. Square resist portions 190 will produce a post having four slightly concave, rounded sides meeting at slightly rounded edges, as shown in FIG. 3B. Triangular resist portions 200 will produce a post having three slightly concave, rounded sides meeting at slightly rounded edges, as shown in FIG. 3C. Each of these photoresist portions produce the "cooling tower" shape shown if a spray etching process is used. If a batch immersion process is used, the resulting posts will have more linearly sloping vertical walls and slightly sharper corners.

Figure 4A:
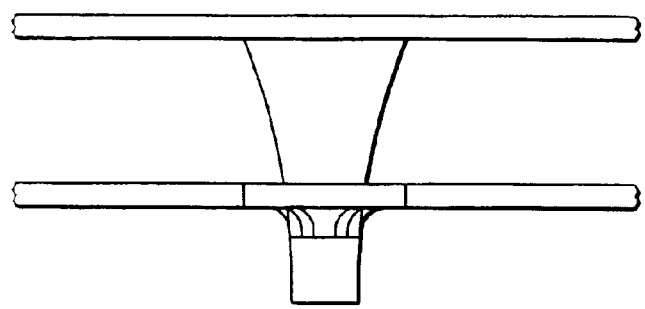
FIG. 4A is an elevational view of a post and socket.
Figure 4B:
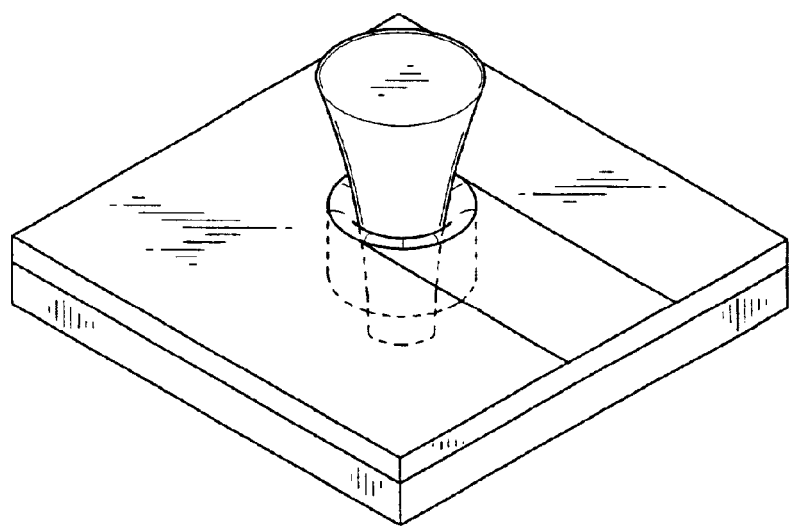
FIG. 4B is a perspective view of a post and socket.

The peaks of the posts 130 may then be coupled to the contact pads on the supporting substrate by any suitable means, such as directly soldering the posts to the contact pads or inserting them into sockets attached to the substrate. The "cooling tower" shape created by spray etching makes for a more reliable leaf-spring socket connection because its peak has a larger diameter than its middle section, as shown in FIG. 4A. The peak of the post will thus provide resistance to being pulled out of the socket in response to forces acting in the lengthwise plane of the posts. The vertical corners on the posts shown in FIGS. 3B and 3C partially inserted into round socket holes or vias also makes for a more reliable, force fit, separable, electrical connection with each socket hole contact, as shown in FIG. 4B.

Figure 5:
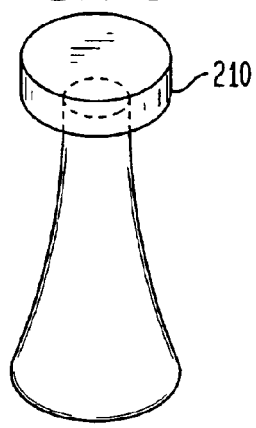
FIG. 5 is a perspective view of a subtractively created interconnection having an etch resistant, conductive cap thereon according to the present invention.

FIG. 5 shows a further embodiment in which the photoresist layer 120, in FIG. 1, is replaced with a plurality of metallic portions 210 of a geometry similar to the photoresist portions (180/190/200) in FIGS. 3A–C. Typically, the metallic portions 210 are comprised of an etch resistant metal, such as nickel. The conductive layer may then be etched around the metallic portions 210 leaving the post capped with a conductive top. This conductive top may then be plated with a highly conductive layer, such as gold or a gold alloy. This conductive top further increases the reliability of an electrical connection when the posts are inserted into the type of socket shown in FIG. 4A. In an alternate embodiment, solder can also be used as an etch resist. After the posts are created, the solder can then be reflowed to create a solder coated post. If the solder is reflowed after the post has been inserted into a test socket, it will create a more permanent electrical connection with the socket.

Figure 6A:
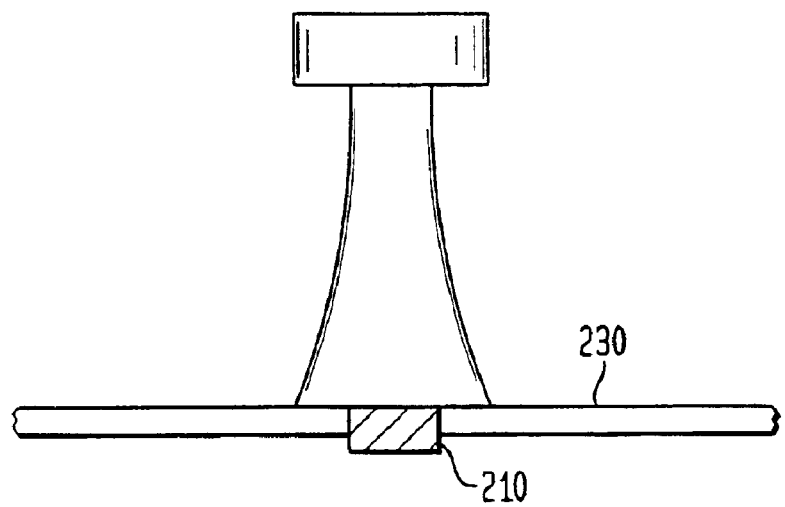
FIG. 6A is an elevational view of a post.
Figure 6B:
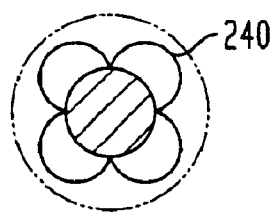
FIG. 6B is a top view of a brazing button and hole.

FIGS. 6A–B show a still further embodiment having a brazing button 220 extending through brazing hole in a removable support structure 230. The brazing button is used to attach the post directly to a bond pad on a microelectronic device and is typically comprised of a metallic alloy which will attach easily and provide a good electrical connection with its respective bond pad, such alloys include gold-tin, bismuth-tin, gold-silicon, or tin-silver. FIG. 6B shows one embodiment of a brazing hole 240 which allows for expansion of the brazing button when it is heated to attach to the chip bond pad. The removable support structure 230 is comprised of a material which may be removed by any suitable means after the posts have been attached to the bond pads, such as using a paper or water soluble polymeric support structure which may be sprayed with water and peeled off.

One skilled in the art will appreciate that the subtractively created posts described herein could be used for many other purposes besides connecting microelectronic devices to supporting substrates without departing from the spirit of the present invention. Further, if the top surfaces of the posts are sufficiently wide, a cupped portion could be provided thereon to receive bumps or solder balls on the surface of a supporting substrate.

Having fully described several embodiments of the present invention, it will be apparent to those of ordinary skill in the art that numerous alternatives and equivalents exist which do not depart from the invention set forth above. It is therefore to be understood that the present invention is not to be limited by the foregoing description, but only by the appended claims.

What is claimed is:

1. A component comprising:

(a) a conductive layer including a plurality of conductive metallic posts extending substantially parallel to one another, said posts having tips; and (b) a bonding material carried on said posts, said bonding material covering the tips of said posts but not covering other portions of said posts, wherein said posts are elongated and said bonding material projects outwardly from said posts at said tips in directions transverse to the direction of elongation of said post.

2. A component as claimed in claim 1 wherein said bonding material is a solder.

3. A component as claimed in claim 1 wherein said bonding material covers only the tips of said posts.

4. A component as claimed in claim 1 wherein said bonding material is in the form of individual portions, each such portion overlying the tip of one of said posts.

5. A component as claimed in claim 1 wherein said portions are circular discs and said posts have surfaces substantially in the form of surfaces of revolution coaxial with said discs.

6. A component as claimed in claim 1 wherein each said post has a height of 125 to 500 microns.

7. A component as claimed in claim 1 further comprising a support structure, said posts projecting from said support structure so that said tips are remote from said support structure, said posts having bases adjacent said support structure.

8. A component as claimed in claim 7 wherein said posts are tapered so that the base of each post is wider than the tip of such post.

9. A component as claimed in claim 7 wherein said support structure includes a polymeric layer.

10. A component as claimed in claim 9 wherein said support structure includes conductive leads on said polymeric layer connected to said posts.

11. A component as claimed in claim 10 wherein said posts project from a first surface of said polymeric layer and said conductive leads are disposed on said first surface of said polymeric layer and the bases of at least some of said posts are connected to said conductive leads.

* * * * *